United States Patent
Lee

(10) Patent No.: US 6,853,405 B2
(45) Date of Patent: Feb. 8, 2005

(54) METHOD OF FABRICATING LIQUID CRYSTAL DISPLAY

(75) Inventor: Jae Gu Lee, Daegu (KR)

(73) Assignee: LG. Philips LCD Co., Ltd., Seoul (KR)

( * ) Notice: Subject to any disclaimer, the term of this patent is extended or adjusted under 35 U.S.C. 154(b) by 30 days.

(21) Appl. No.: 10/612,977

(22) Filed: Jul. 7, 2003

(65) Prior Publication Data

US 2004/0048407 A1 Mar. 11, 2004

(30) Foreign Application Priority Data

Sep. 10, 2002 (KR) .............................. 10-2002-0054536

(51) Int. Cl.$^7$ ............................................. G02F 1/1345
(52) U.S. Cl. ............................ 349/39; 349/38; 438/30
(58) Field of Search ........................ 349/38, 39; 438/30

(56) References Cited

U.S. PATENT DOCUMENTS 6,744,486 B2 * 6/2004 Kim et al. .................. 349/187
6,762,802 B2 * 7/2004 Ono et al. .................... 349/38

* cited by examiner

Primary Examiner—Kenneth Parker
Assistant Examiner—Thanh-Nhan P Nguyen
(74) Attorney, Agent, or Firm—McKenna Long & Aldridge LLP

(57) ABSTRACT

There is disclosed a method of fabricating a liquid crystal display that is adaptive for increasing the capacitance of a storage capacitor. A method of fabricating a liquid crystal display according to an embodiment of the present invention includes forming a thin film transistor at an area where a gate line crosses a data line; forming a protective film to cover a substrate where the thin film transistor is formed; simultaneously forming a perforation hole and a contact hole by selectively eliminating the protective film using a partial exposure mask; and forming a pixel electrode contacting a gate insulating film and a drain electrode of the thin film transistor through the perforation hole and the contact hole respectively.

8 Claims, 14 Drawing Sheets

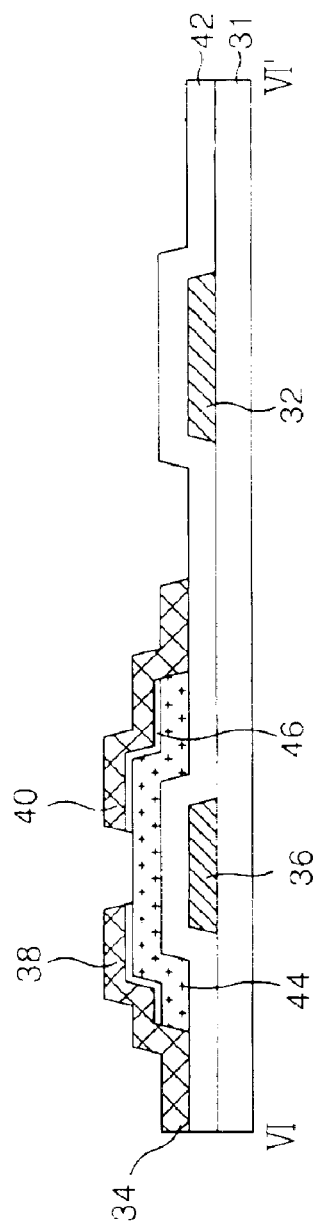
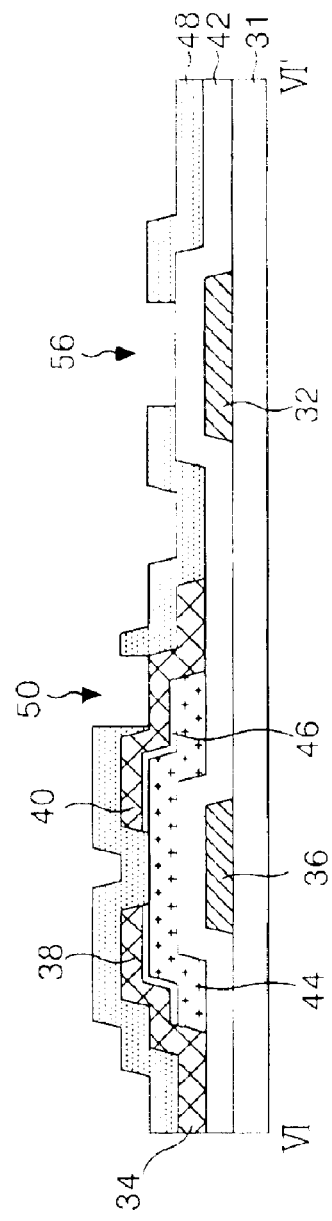

METHOD OF FABRICATING LIQUID CRYSTAL DISPLAY

This application claims the benefit of the Korean Patent Application No. 2002-54536, filed on Sep. 10, 2002, which is hereby incorporated by reference for all purposes as if fully set forth herein.

BACKGROUND OF THE INVENTION

1. Field of the Invention

The present invention relates to a liquid crystal display, and more particularly to a method of fabricating a liquid crystal display having a storage capacitor with increased capacitance.

2. Description of the Related Art

Generally, liquid crystal displays (LCD) display a picture by controlling light transmittance using electric fields. To this end, an LCD includes a liquid crystal display panel having liquid crystal cells arranged in a matrix, and a drive circuit to drive the liquid crystal display panel. The liquid crystal display panel is provided with a common electrode and pixel electrodes to apply an electric field to each liquid crystal cell. Typically, pixel electrodes are formed on a lower substrate in liquid crystal cells, whereas the common electrode is integrally formed on the entire surface of an upper substrate. Each pixel electrode is connected to a thin film transistor (TFT) that is used as a switching device. The pixel electrode along with the common electrode drives the liquid crystal cell in accordance with a data signal applied via the TFT.

Referring to FIGS. 1 and 2, a liquid crystal display includes a TFT TP arranged at each crossing of data lines 4 and gate lines 2, a pixel electrode 22 connected to a drain electrode 10 of the TFT, and a storage capacitor SP located at an overlapping part of the pixel electrode 22 and the gate line 2.

The TFT TP includes a gate electrode 6 connected to the gate line 2, a source electrode 8 connected to the data line 4, and a drain electrode 10 connected to the pixel electrode 22 through a drain contact hole 20. Further, the TFT TP includes semiconductor layers 14 and 16 to form a channel between the source electrode 8 and the drain electrode 10 by a gate voltage applied to the gate electrode 6. Such a TFT TP responds to a gate signal from the gate line 2 to selectively apply a data signal from the data line 4 to the pixel electrode 22.

The pixel electrode 22 is located at a cell area partitioned off by the data line 4 and the gate line 2, and is made from a transparent conductive material having a high light transmittance. The pixel electrode 22 generates a potential difference together with a common electrode (not shown) formed at an upper substrate (not shown) by the data signal applied through the drain contact hole 20. This potential difference causes liquid crystals located between the lower substrate 1 and the upper substrate (not shown) to rotate by their dielectric anisotropy. Accordingly, a light applied from a light source via the pixel electrode 22 is transmitted toward the upper substrate.

The storage capacitor SP limits voltage variation in the pixel electrode 22. The storage capacitor SP includes a gate line 2, and a storage electrode 24 formed to overlap the gate line 2 with a gate insulating film 12 therebetween. The storage electrode 24 is electrically connected to the pixel electrode 22 through a storage contact hole 26 formed on a protective film 18.

A method of fabricating the liquid crystal display will be described in conjunction with FIGS. 3A through FIG. 3E.

First, a gate metal layer is deposited on the lower substrate 1 and then patterned to form the gate line 2 and the gate electrode 6 as shown in FIG. 3A. A first insulating material is deposited on the lower substrate 1 provided with the gate line 2 and the gate electrode 6, thereby forming the gate insulating film 12 as shown in FIG. 3B. First and second semiconductor materials are deposited on the gate insulating film 12 and then patterned to form an active layer 14 and an ohmic contact layer 16.

Subsequently, a data metal layer is deposited on the gate insulating film 12 and then patterned to form the data line 4, the storage electrode 24, the source electrode 8 and the drain electrode 10 as shown in FIG. 3C. Thereafter, a second insulating material is deposited thereon to form a protective film 18 as shown in FIG. 3D, and then the drain contact hole 20 and the storage contact hole 26 are formed to pierce the protective film 18.

A transparent conductive material is deposited on the lower substrate 1 provided with the protective film 18 and then patterned to form the pixel electrode 22 as shown in FIG. 3E.

The storage capacitor SP of the related art liquid crystal display is made up of the storage capacitor 24 and the gate line 2, which overlap each other having the gate insulating film 12 therebetween. In this case, the process becomes more complicated since a separate storage electrode 24 needs to be formed for the storage capacitor, increasing the probability that a pattern defect may be generated.

In order to solve such a problem, the storage capacitor shown in FIGS. 4A and 4B is made up of the pixel electrode 22 and the gate line 2, which face each other with the gate insulating film 12 and the protective film 18 therebetween. In this case, since it is not necessary to form a separate storage electrode 24, there is an advantage in that the probability of generating the pattern defect is reduced.

However, the distance between the electrodes 2 and 22 is greater when the storage capacitor is made up of the pixel electrode 22 and the gate line 2, with both of the gate insulating film 12 and the protective film 18 therebetween, than when the storage capacitor is made up of the gate line 2 and the storage electrode 24 with only the gate insulating film 12 therebetween. Accordingly, there is a problem in the related art having both of the gate insulating film 12 and the protective film 18, in that the capacitance of the storage capacitor is reduced because capacitance is inversely proportional to the distance between the electrodes 2 and 22. In particular, when the protective film 18 is formed of an organic insulating material, as shown in FIG. 4B, to increase aperture ratio, the protective film 18 is relatively lower in dielectric constant and greater in thickness than when the protective film 18 is formed of an inorganic insulating material as shown in FIG. 4A. Therefore, there is a problem in that the capacitance of the storage capacitor is reduced more because capacitance is proportional to dielectric constant and inversely proportional to the distance between electrodes.

SUMMARY OF THE INVENTION

Accordingly, the present invention is directed to a method of fabricating a liquid crystal display having a storage capacitor with increased capacitance that substantially obviates one or more problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with purpose of the present invention, as embodied and broadly described, a method of fabricating a liquid crystal display according to an aspect of the present invention includes forming a thin film transistor at an area where a gate line crosses a data line; forming a protective film to cover a substrate where the thin film transistor is formed; simultaneously forming a perforation hole and a contact hole by selectively eliminating the protective film by use of a partial exposure mask; and forming a pixel electrode contacting a gate insulating film and a drain electrode of the thin film transistor through the perforation hole and the contact hole respectively.

In another aspect of the present invention, forming the thin film transistor includes forming the gate line and a gate electrode on the substrate; forming the gate insulating film on the substrate to cover the gate electrode and the gate line; forming a semiconductor layer on the gate insulating film; and forming a source electrode and the drain electrode on the substrate where the semiconductor layer is formed.

In another aspect, the contact hole extends through the protective film to expose the drain electrode.

In yet another aspect, the perforation hole exposes the gate insulating film that overlaps the gate line.

In yet another aspect, the partial exposure mask includes a full exposure area, a shielding area and a partial exposure area.

In another aspect, forming the perforation hole and the contact hole includes depositing a photoresist on the substrate where the protective film is formed; eliminating the photoresist formed on the drain electrode and forming a photoresist pattern with a first area on the gate line and a photoresist pattern with a second area elsewhere by photolithography using the partial exposure mask at the same time; and eliminating an area of the protective film corresponding to the drain electrode and an area of the protective film corresponding to the first area by use of the photoresist pattern as a mask.

In yet another aspect, the first area in the photoresist pattern corresponds to the partial exposure area of the mask and the second area corresponds to the shielding area.

The thickness of an area of the protective film corresponding to the partial exposure area is about 70% of the thickness of an area of the protective film corresponding to the shielding area.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 7A to 7E are sectional views illustrating a fabricating method of the liquid crystal display shown in FIG. 6.

DETAILED DESCRIPTION OF THE ILLUSTRATED EMBODIMENTS

Reference will now be made in detail to the preferred embodiments of the present invention, examples of which are illustrated in the accompanying drawings.

Figure 1:
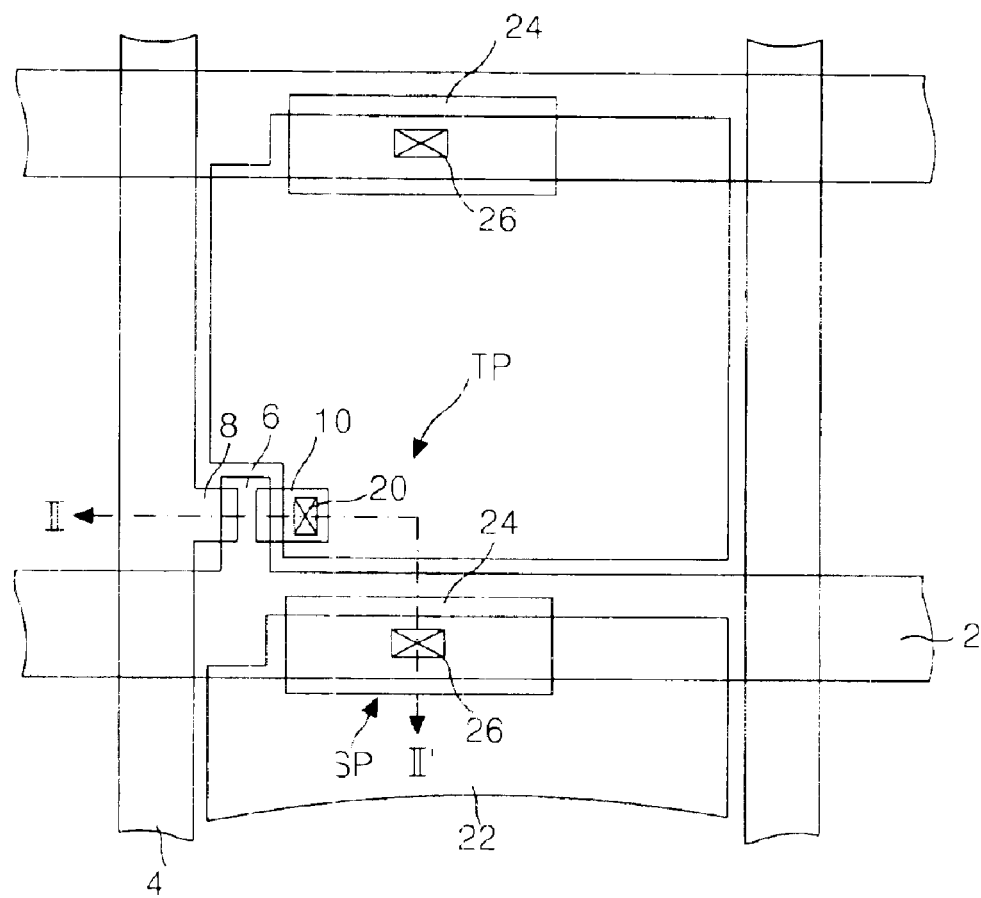
FIG. 1 is a plan view illustrating a liquid crystal display of the related art.
Figure 2:
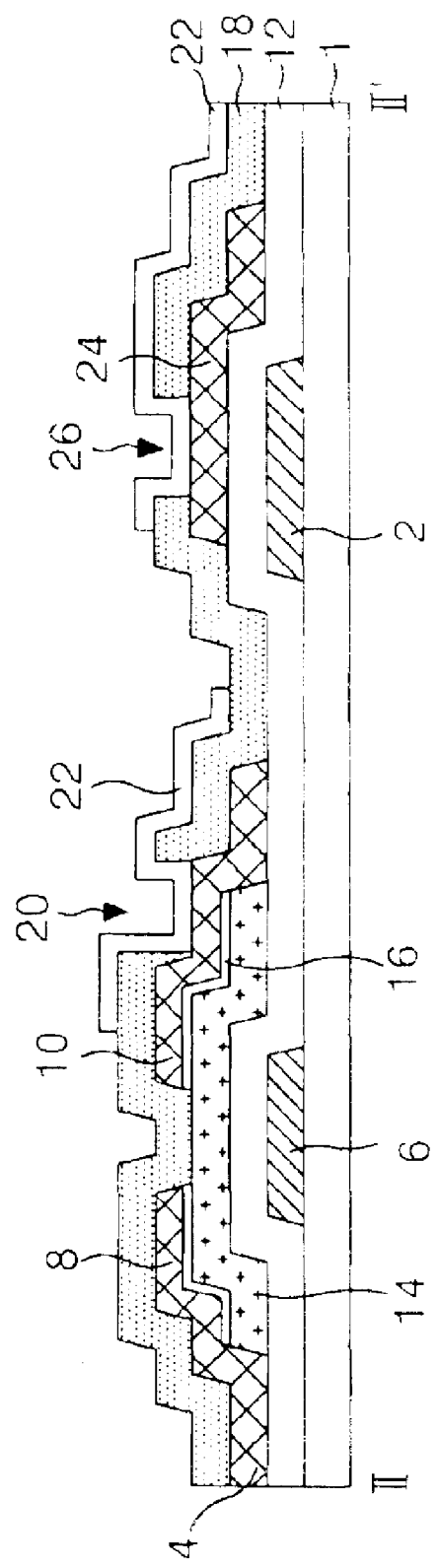
FIG. 2 is a sectional view illustrating a liquid crystal display taken along the line II–II' in FIG. 1.
Figure 3A:
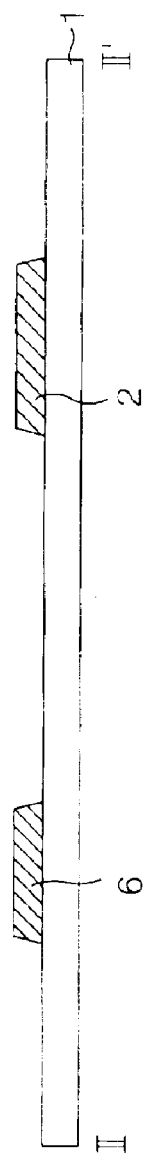
FIGS. 3A to 3E are sectional views illustrating a fabricating method of the liquid crystal display shown in FIG. 2.
Figure 3B:
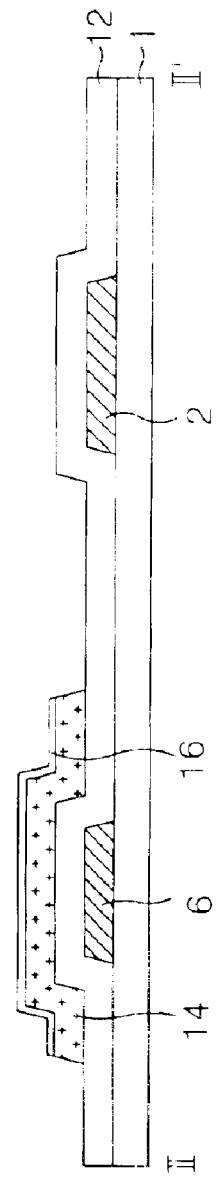
Figure 3C:
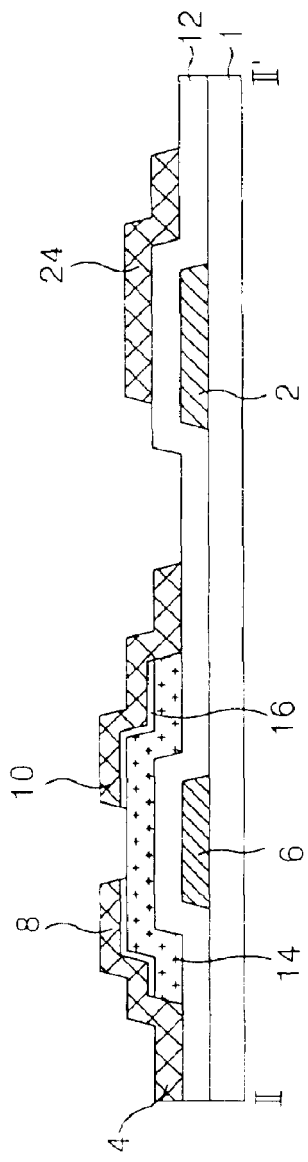
Figure 3D:
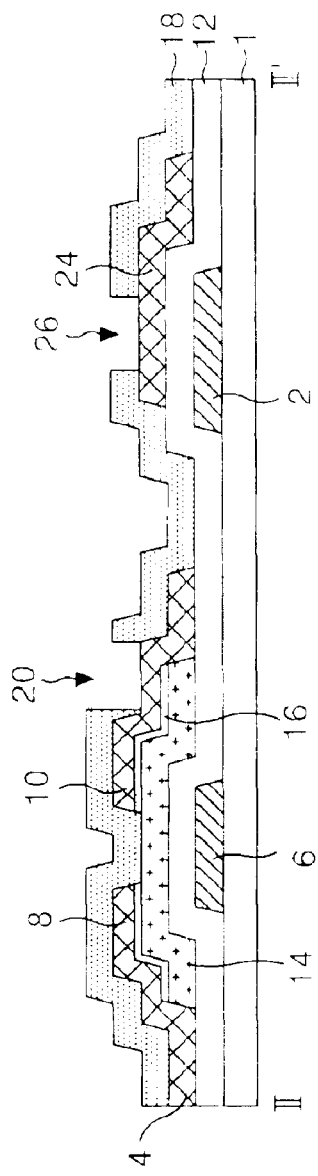
Figure 3E:
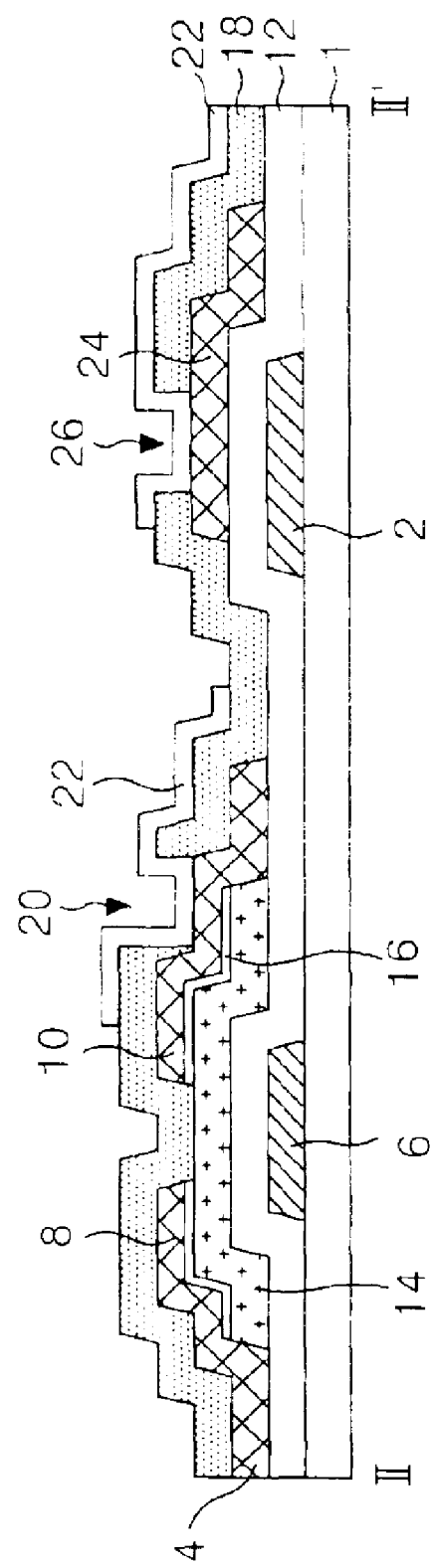
Figure 4A:
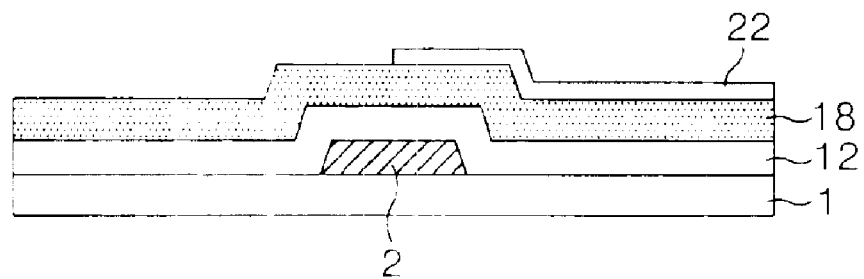
FIGS. 4A to 4B are sectional views illustrating another type of a storage capacitor.
Figure 4B:
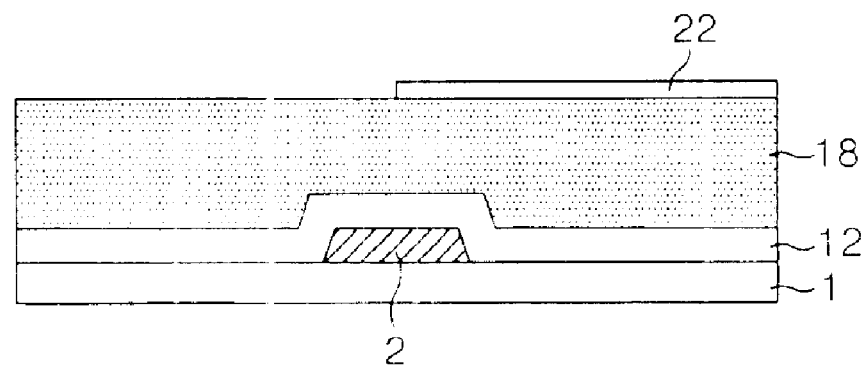
Figure 5:
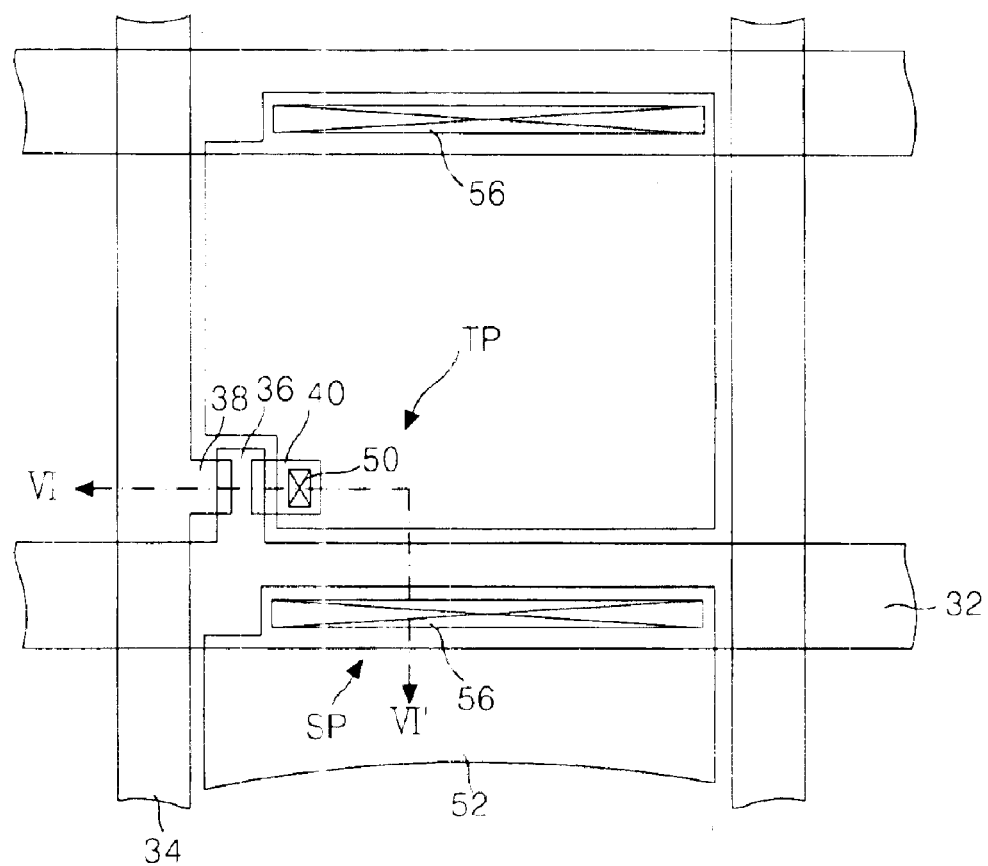
FIG. 5 is a plan view illustrating a liquid crystal display according to the present invention.
Figure 6:
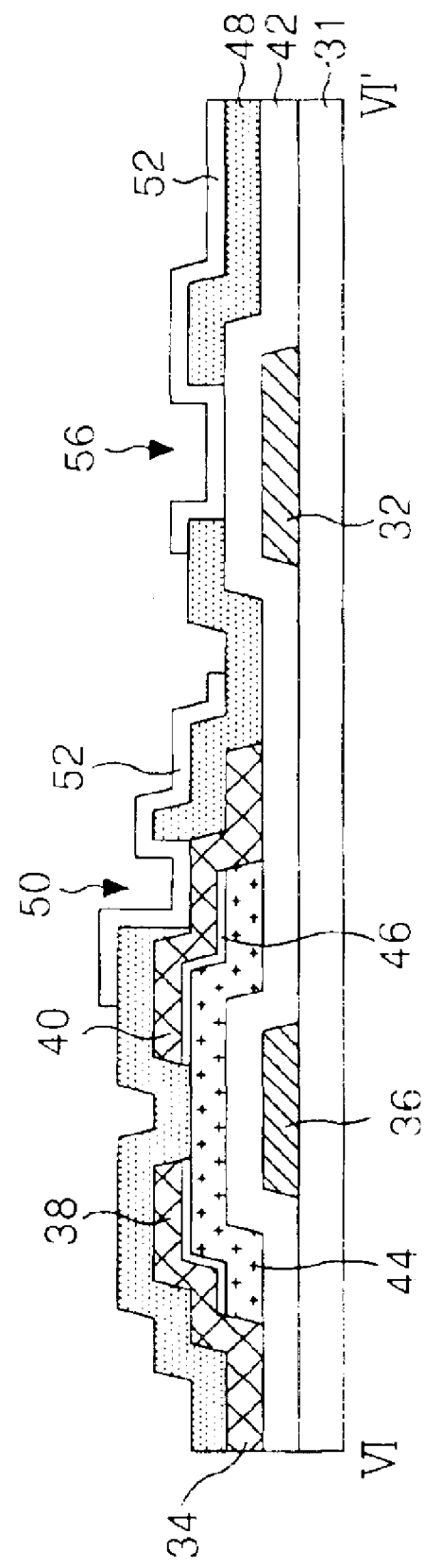
FIG. 6 is a sectional view illustrating the liquid crystal display taken along the line IV–IV' in FIG. 5.

FIG. 5 is a plan view representing a liquid crystal display according to the present invention. FIG. 6 is a sectional view representing the liquid crystal display taken along the line IV–IV' in FIG. 5.

Referring to FIGS. 5 and 6, a lower substrate 31 of the liquid crystal display according to the present invention includes a TFT TP located at each intersection part of data lines 34 and gate lines 32, a pixel electrode 52 connected to a drain electrode 40, and a storage capacitor SP located at an area where the pixel electrode 52 overlaps a pre-stage gate line 32.

The TFT TP includes a gate electrode 36 connected to the gate line 32, a source electrode 38 connected to the data line 34, and a drain electrode 40 connected to the pixel electrode 52 through a drain contact hole 20. Further, the TFT TP includes semiconductor layers 44 and 46 that form a channel between the source electrode 38 and the drain electrode 40 by a gate voltage applied to the gate electrode 36. The TFT TP responds to a gate signal from the gate line 32 to selectively apply a data signal from the data line 34 to the pixel electrode 52.

The pixel electrode 52 is located at a cell area bounded by the data line 34 and the gate line 32, and is made from a transparent electrically conductive material with a high light transmittance. The pixel electrode 52 generates a potential difference together with a common electrode (not shown) formed at an upper substrate (not shown) by the data signal applied through the drain contact hole 50. This potential difference causes liquid crystals located between the lower substrate 31 and the upper substrate (not shown) to rotate based on dielectric anisotropy. Accordingly, a light applied from a light source via the pixel electrode 52 is transmitted toward the upper substrate.

The storage capacitor SP controls voltage variation in the pixel electrode 22. The storage capacitor SP includes a pre-stage gate line 32, and a pixel electrode 52 formed over the gate line 32 with a gate insulating film 42 therebetween.

The pixel electrode 52 is in contact with the gate insulating film 42 through a perforation hole 56 extending through a protective film 48.

Accordingly, the storage capacitor SP is made up of the gate line 32, the pixel electrode 52, and the gate insulating film 42. Because there is no separate storage electrode required in this invention, as contrasted with the storage capacitor of the related art, the fabrication process becomes simple, reducing the generation of pattern defects. Further, the storage capacitor SP of the liquid crystal display according to the present invention has a greater capacitance than a storage capacitor that is made up of the gate line and the pixel electrode with both the gate insulating film and the protective film therebetween.

FIGS. 7A to 7E are diagrams representing a method of fabricating a liquid crystal display shown in FIG. 6.

Figure 7A:
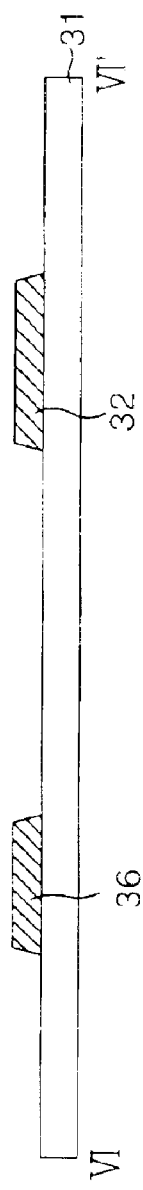

Referring to FIG. 7A, the gate line 32 and the gate electrode 36 are formed on the substrate 31.

To this end, a gate metal layer is deposited by deposition methods, such as sputtering, on the substrate 31. The gate metal layer is made from aluminum AL or aluminum alloy etc. Subsequently, the gate metal layer is patterned by photolithography, including etching, using a first mask (not shown) so as to form the gate line 32 and the gate electrode 36 on the lower substrate 31.

Figure 7B:
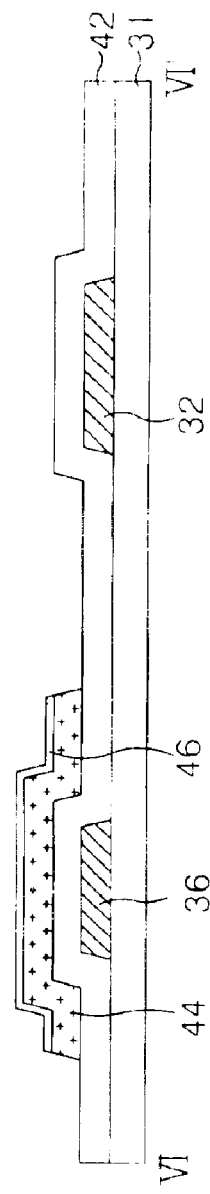

Referring to FIG. 7B, a gate insulating film 42, an active layer 44 and an ohmic contact layer 46 are formed on the substrate 31 provided with the gate line 32 and the gate electrode 36.

To this end, an organic insulating material, such as silicon oxide $SiO_x$ or silicon nitride $SiN_x$, etc., is deposited on the substrate 31 provided with the gate line 32 and the gate electrode 36 to form the gate insulating film 42. First and second semiconductor layers are continuously deposited on the gate insulating film 42 by a chemical vapor deposition method. The first semiconductor layer is formed of amorphous silicon that is not doped with impurities, and the second semiconductor layer is formed of amorphous silicon that is doped with n-type or p-type impurities. Subsequently, the first and second semiconductor layers are patterned by photolithography, including dry-etching, using a second mask (not shown), thereby forming the active layer 44 and the ohmic contact layer 46.

Referring to FIG. 7C, the data line 34 and the source and drain electrodes 38 and 40 are formed on the lower substrate 31 provided with the active layer 44 and the ohmic contact layer 46.

To this end, a data metal layer is deposited by a deposition method such as a CVD method or a sputtering method on the lower substrate 31 provided with the active layer 44 and the ohmic contact layer 46. The data metal layer is made from chromium Cr or molybdenum Mo, etc. Subsequently, the data metal layer is pattern by photolithography, including wet-etching, using a third mask (not shown), thereby forming the data line 34, the source electrode 38 and the drain electrode 40. And then, the ohmic contact layer 46 exposed between the source electrode 38 and the drain electrode 40 is eliminated by the dry etching process to separate the source electrode 38 from the drain electrode 40. Since the ohmic contact layer 46 is eliminated partially, an area corresponding to the gate electrode 36 between the source and drain electrodes 38 and 40 in the active layer 44 becomes a channel.

Referring to FIG. 7D, a protective film 48 is formed on the lower substrate 31 provided with the source electrode 38 and the drain electrode 40.

To this end, the protective film 48 is formed on the lower substrate 31 provided with the source electrode 38 and the drain electrode 40, by depositing an insulating material. The protective film 48 is made from an organic insulating material, such as acrylic organic compound, benzocyclobutane (BCB), perfluorocyclobutane (PFCB), or the like, or and inorganic insulating material, such as silicon nitride ($SiN_x$), silicon oxide ($SiO_x$), or the like. Subsequently, the protective film 48 is patterned by photolithography, including etching, using a fourth mask (not shown), thereby forming the drain contact hole 50 and the perforation hole 56.

The drain contact hole 50 is formed to extend through the protective layer 48, thereby exposing part of the gate insulating film 42 at an area where the gate insulating film overlaps the gate line 32. A process of forming the perforation hole 56 and the drain contact hole 50 will be further described later.

Figure 7E:
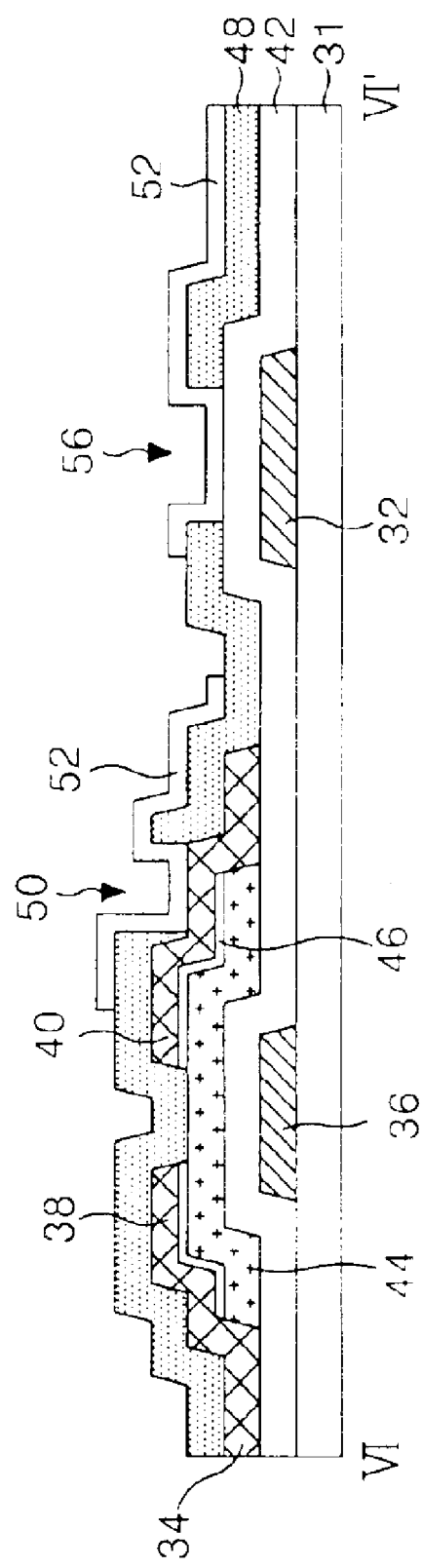

Referring to FIG. 7E, a pixel electrode 52 is formed on the lower substrate 31 provided with the protective film 48.

To this end, a transparent conductive material is deposited on the protective film 48 by a deposition method such as sputtering. The transparent conductive material is indium tin oxide (ITO), indium zinc oxide (IZO), indium tin zinc oxide (ITZO), or the like. Subsequently, the transparent conductive material is patterned by photolithography, including etching, using a fifth mask (not shown).

The pixel electrode 52 is electrically connected to the drain electrode 40 through the drain contact hole 50 piercing the protective film 48. Further, the pixel electrode 52 is connected to the gate insulating film 42 through the perforation hole 56 extending through the protective film 48 to form the storage capacitor SP together with the gate line 32 that is formed under the pixel electrode 52 with the gate insulating film therebetween.

Figure 8A:
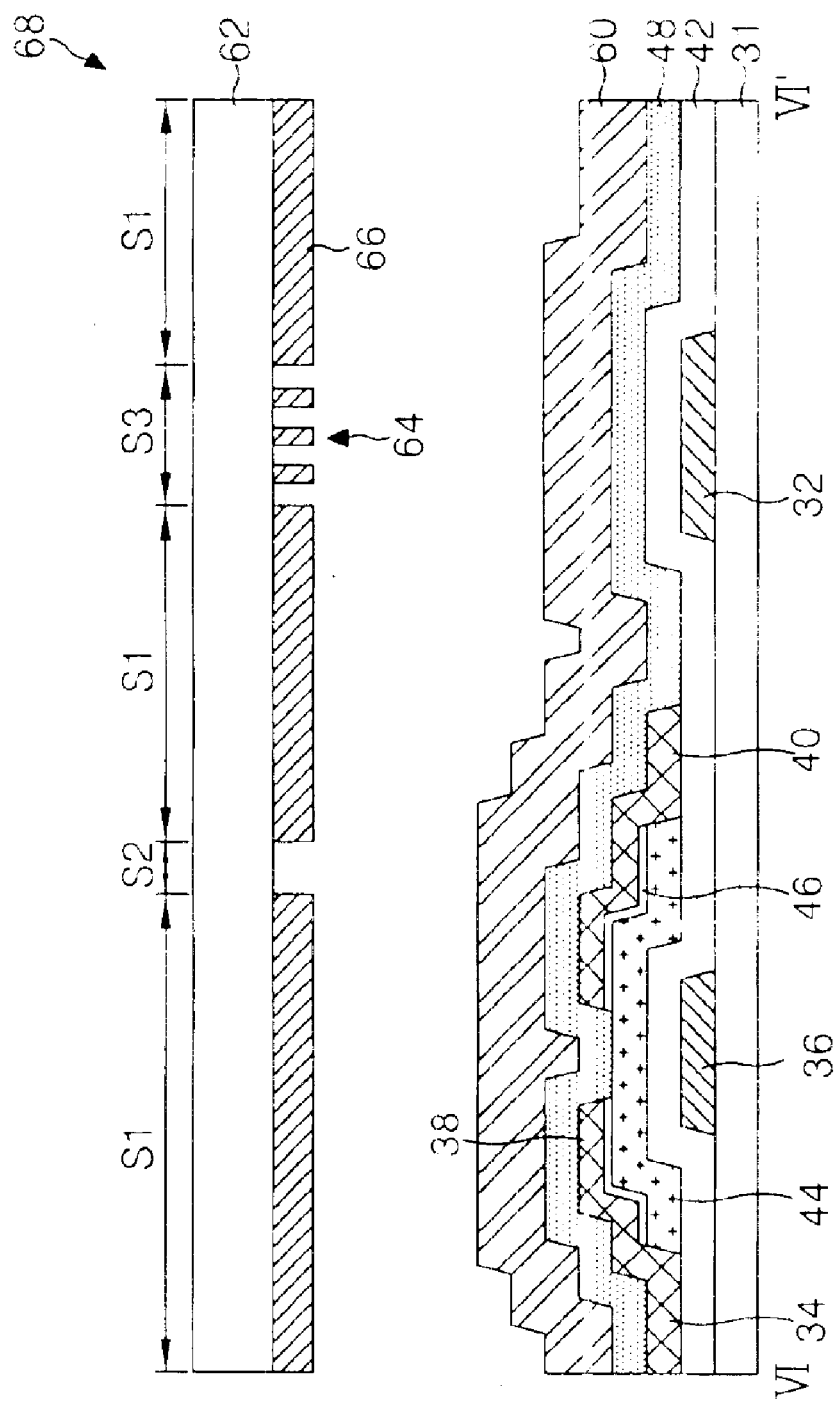
FIGS. 8A to 8C are sectional views illustrating a fabricating method for forming a contact hole and a perforation hole shown in FIG. 7D.
Figure 8B:
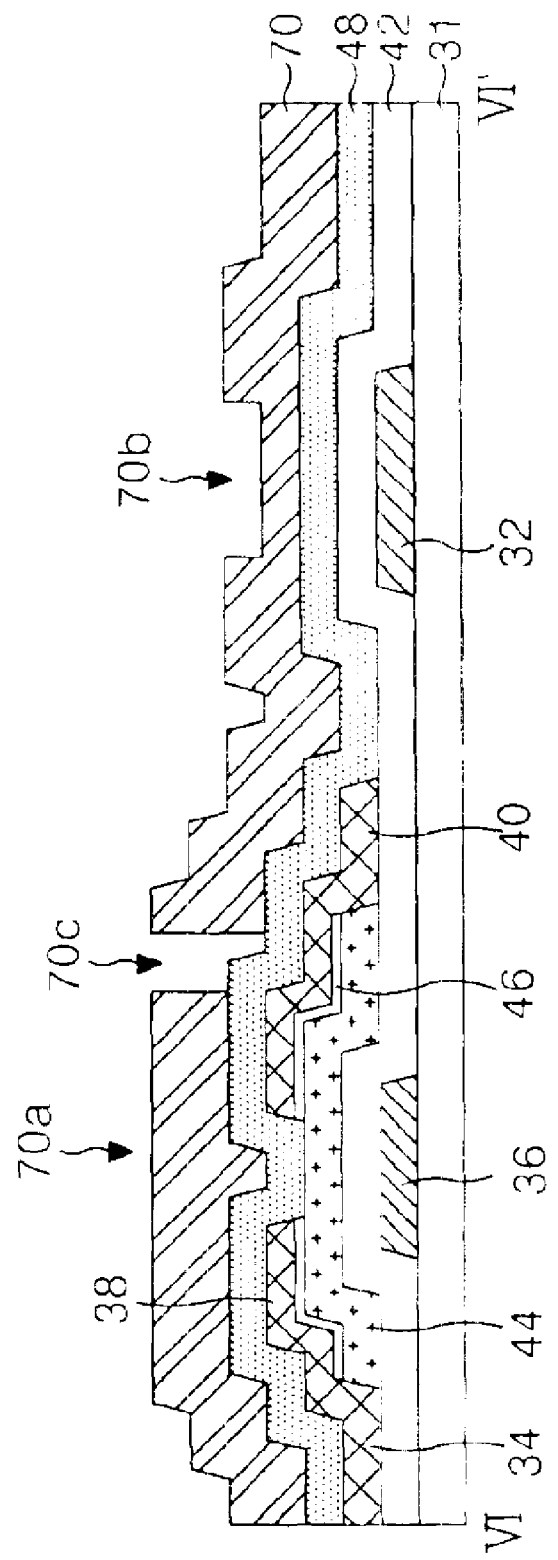
Figure 8C:
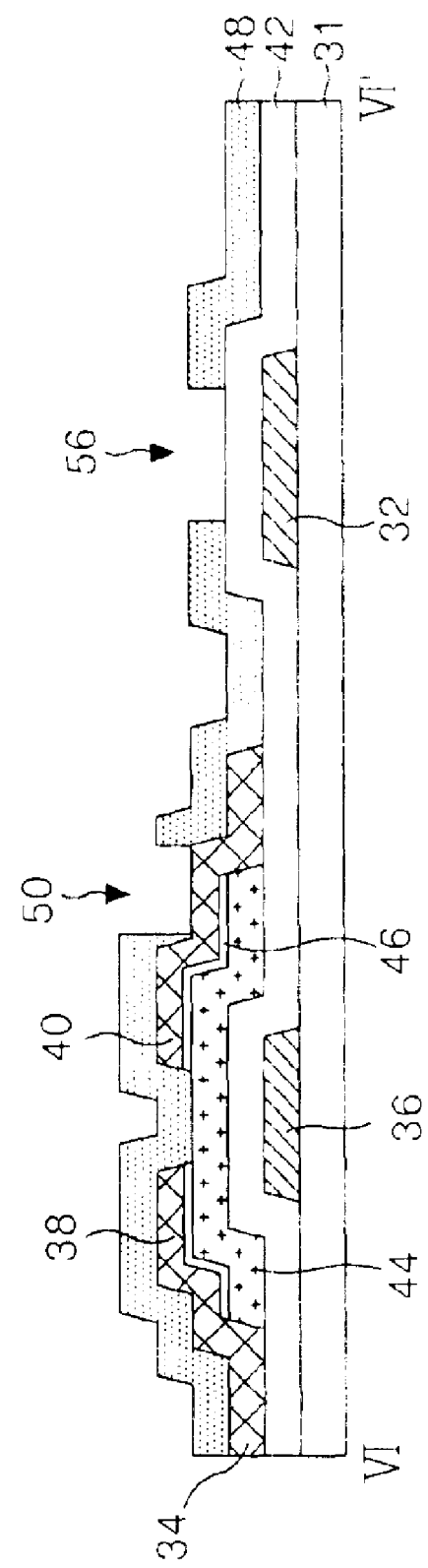

FIGS. 8A to 8C represent diagrams of a fabricating method of forming a contact hole and a perforation hole shown in FIG. 7D.

Referring to FIG. 8A, a photoresist 60 is spread on the entire surface of the lower substrate 31 provided with the protective film 48. And then, the fourth mask 68, which is a halftone mask or a diffractive mask, is aligned with the lower substrate 31. Herein, the fourth mask 68 includes a partial transmission layer 64 formed at a partial exposure area S3 of a transparent mask substrate 62 and a shielding layer formed at a shielding area S1. And the fourth mask 68 is formed to expose the transparent mask substrate 62 intact at the full exposure area S2.

Referring to FIG. 8B, the photolithography using the fourth mask 68 completely eliminates he photoresist fully exposed through the full exposure area S2, and forms a photoresist pattern 70 partially exposed or not exposed through the partial exposure area S3 and the shielding area S1. In particular, a first photoresist pattern 70A, which is not exposed by the shielding layer 66 of the fourth mask 68, in the photoresist pattern 70 is formed to have a first height, and a second photoresist pattern 70B, which is partially exposed by the partial transmission layer 64 of the fourth mask 68, is formed to have a second height that is relatively lower than the first height.

Referring to FIG. 8C, the protective film 48 is patterned by dry-etching using the photoresist pattern 70 as a mask. Accordingly, the drain contact hole 50 and the perforation hole are formed to extend through the protective film 48.

The protective film 48 reacts to a dry-etching gas when forming the drain contact hole 50, whereas the drain electrode 40 does not, thus the protective film 48 is etched to expose the drain electrode 40. Further, the protective film 48 and the gate insulating film 42 react on the dry-etching gas when forming the perforation hole 56, whereas the photoresist pattern 70B for forming the perforation hole 56 is relatively thin, thus the gate insulating film 42 is not etched and only the protective film 48 is selectively etched.

Herein, an area of the protective film 48 covering the TFT, where the shielding layer 66 of the fourth mask 68 is located, is made to keep about 100% of its thickness. And an area of protective film 48 overlapping the gate line 32, where the partial transmission layer 64 of the fourth mask is located, is patterned to leave about 70% of its thickness.

Then, the photoresist pattern 70 remaining at the protective film 48 and the source and drain electrodes 38 and 40 is eliminated by a strip process.

As described above, according to the fabricating method of the liquid crystal display of the present invention, the storage capacitor is made up of the pixel electrode and the gate line with the gate insulating film therebetween. At this moment, only the protective film is patterned among the protective film and the gate insulating film formed between the pixel electrode and the gate line using the diffractive mask or the halftone mask, thereby leaving the gate insulating film between the pixel electrode and the gate line. In this way, the thickness of the insulating film formed between the pixel electrode and the gate line can be selectively reduced using a diffractive exposure technique, thereby increasing the capacitance of the storage capacitor. Further, the probability of generating pattern defects is reduced because no separate storage capacitor is formed.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A fabricating method of a liquid crystal display, comprising:

forming a thin film transistor at an area where a gate line crosses a data line;

forming a protective film to cover a substrate where the thin film transistor is formed;

simultaneously forming a perforation hole and a contact hole by selectively eliminating the protective film using a partial exposure mask; and forming a pixel electrode contacting a gate insulating film and a drain electrode of the thin film transistor through the perforation hole and the contact hole respectively.

2. The fabricating method according to claim 1, wherein forming the thin film transistor includes:

forming the gate line and a gate electrode on the substrate;

forming the gate insulating film on the substrate to cover the gate electrode and the gate line;

forming a semiconductor layer on the gate insulating film; and forming a source electrode and the drain electrode on the substrate where the semiconductor layer is formed.

3. The fabricating method according to claim 2, wherein the contact hole extends through the protective film to expose the drain electrode.

4. The fabricating method according to claim 2, wherein the perforation hole exposes the gate insulating film that overlaps the gate line.

5. The fabricating method according to claim 3, wherein the partial exposure mask includes a full exposure area, a shielding area and a partial exposure area.

6. The fabricating method according to claim 5, wherein forming the perforation hole and the contact hole includes:

depositing a photoresist on the substrate where the protective film is formed;

eliminating the photoresist formed on the drain electrode and forming a photoresist pattern with a first area on the gate line and a photoresist pattern with a second area elsewhere by photolithography using the partial exposure mask at the same time; and eliminating an area of the protective film corresponding to the drain electrode and an area of the protective film corresponding to the first area using the photoresist pattern as a mask.

7. The fabricating method according to claim 6, wherein the first area in the photoresist pattern corresponds to the partial exposure area of the mask and the second area corresponds to the shielding area.

8. The fabricating method according to claim 5, wherein the thickness of an area of the protective film corresponding to the partial exposure area is about 70% of the thickness of an area of the protective film corresponding to the shielding area.

\* \* \* \* \*